United States Patent
Barnes et al.

(10) Patent No.: US 8,129,738 B2
(45) Date of Patent: Mar. 6, 2012

(54) OPTOELECTRONIC DEVICE WITH PERIODIC GRATING MICROSTRUCTURE

(75) Inventors: William L Barnes, Exeter (GB); John R Sambles, Crediton (GB); Ian R Hooper, Exeter (GB); Stephen Wedge, St Ives (GB)

(73) Assignee: QinetiQ Limited, London (GB)

( * ) Notice: Subject to any disclaimer, the term of this patent is extended or adjusted under 35 U.S.C. 154(b) by 0 days.

(21) Appl. No.: 12/659,413

(22) Filed: Mar. 8, 2010

(65) Prior Publication Data

US 2011/0024778 A1 Feb. 3, 2011

Related U.S. Application Data

(63) Continuation of application No. 10/522,988, filed as application No. PCT/GB03/03343 on Jul. 31, 2003, now abandoned.

(30) Foreign Application Priority Data

Aug. 2, 2002 (GB) .................................. 0217900.0

(51) Int. Cl.
*H01L 33/00* (2010.01)

(52) U.S. Cl. ............ 257/98; 257/E33.067; 257/E33.074; 257/E33.044; 372/102

(58) Field of Classification Search .................. 257/98
See application file for complete search history.

(56) References Cited

U.S. PATENT DOCUMENTS

| | | | |
|---|---|---|---|
| 4,555,622 A | 11/1985 | Glass et al. | |
| 4,556,790 A | 12/1985 | Glass et al. | |
| 4,915,482 A | 4/1990 | Collins et al. | 359/276 |
| 6,400,744 B1 | 6/2002 | Capasso et al. | 372/96 |
| 6,441,298 B1 | 8/2002 | Thio | |
| 6,534,798 B1 | 3/2003 | Scherer et al. | 257/98 |
| 6,670,772 B1 | 12/2003 | Arnold et al. | |
| 7,038,373 B2 | 5/2006 | Arnold et al. | |
| 2004/0012328 A1 | 1/2004 | Arnold et al. | |
| 2004/0012980 A1 | 1/2004 | Sugiura et al. | |

FOREIGN PATENT DOCUMENTS

| | | |
|---|---|---|
| EP | 0442002 | 8/1991 |
| JP | 59-108376 | 6/1984 |
| JP | 2002-76410 | 3/2002 |
| JP | 2004-31350 | 1/2004 |
| JP | 2004-55551 | 2/2004 |
| WO | WO 98/25313 | 6/1998 |
| WO | WO 00/70691 | 11/2000 |
| WO | WO 02/35890 | 5/2002 |

OTHER PUBLICATIONS

European Examination Report dated Jun. 8, 2010 for EP 03 766 464.6.

P.A. Hobson et al, "The Role of Surface Plasmons in Organic Light-Emitting Diodes" *IEEE Journal on Selected Topics in Quantum Electronics*, vol. 8, No. 2, Mar./Apr. 2002, pp. 378-386.

J. Vuckovic et al, "Surface Plasmon Enhanced LED" 2000 Conference on Lasers and Electro-optics, pp. 123-124.

(Continued)

*Primary Examiner* — Wael Fahmy
*Assistant Examiner* — Abul Kalam
(74) *Attorney, Agent, or Firm* — Nixon & Vanderhye P.C.

(57) ABSTRACT

This invention relates to optoelectronic devices of improved efficiency. In particular it relates to light emitting diodes, photodiodes and photovoltaics. By careful design of periodic microstructures, e.g. gratings, associated with such devices more efficient light generation or detection is achieved.

12 Claims, 6 Drawing Sheets

OTHER PUBLICATIONS

P. Hobson et al, "Surface Plasmon Mediated Emission from Organic Light-Emitting Diodes" *Advanced Materials*, vol. 14, No. 19, Oct. 2002, pp. 1393-1396.

W.L. Barnes, "Electromagnetic Crystals for Surface Plasmon Polaritons and the Extraction of Light from Emissive Devices" *Journal of Lightwave Technology*, vol. 17, No. 11, Nov. 1999, pp. 2170-2182.

D.K. Gifford, "Emission Through One of Two Metal Electrodes of an Organic Light-Emitting Diode Via Surface-Plasmon Cross Coupling" *Applied Physics Letters*, vol. 81, No. 23, Dec. 2002, pp. 4315-4317.

A. Kock et al, "Strongly directional emission from AIGaAs/GaAs light-emitting diodes" *Appl. Phys. Lett.*, vol. 57, Issue 22, pp. 2327-2329.

Fig. 1.

Emitted light

Fig. 1(a).

Light emission through cathode

OPTOELECTRONIC DEVICE WITH PERIODIC GRATING MICROSTRUCTURE

This application is a Continuation of application Ser. No. 10/522,988, filed Feb. 2, 2005, which is the US national phase of international application PCT/GB2003/003343, filed in English on 31 Jul. 2003, which designated the US. PCT/GB2003/003343 claims priority to GB Application No. 0217900.0 filed 2 Aug. 2002. The entire contents of these applications are incorporated herein by reference.

This invention relates to improved optoelectronic devices, in particular it relates to optoelectronic devices such as light emitting diodes (LEDs), photodiodes and photovoltaic cells.

Optoelectronic devices include devices that generate light radiation and those that detect light radiation. Typically such devices are used in displays and sensors.

Many optoelectronic devices continue to be refined and improved. It is an on-going objective with regard to the development of such devices that they should be as efficient as possible. For example desirable improvements include increased brightness from an LED or photodiodes that may operate successfully with lower levels of input light.

An organic LED essentially consists of a light emitting layer sandwiched between an anode and a cathode. Typically the anode is in contact with a substrate.

Electrons and holes combine in the light emitting layer to produce light via the decay of excitons. In addition to generating "useful" light radiation, both heat and trapped optical modes may also be produced.

Usually light is emitted through the anode, however more recently organic LED emission through a planar metal cathode has been demonstrated by Hung et al, Appl. Phys. Lett., 78, 544 (2001).

The presence of a metallic cathode cannot usually be avoided. In addition to its necessary electrical function, it also significantly modifies the optical properties of the structure. Such modifications can be advantageous. For example where emission is to take place through a (semi-) transparent anode, light that was initially directed towards the cathode may be partially reflected so as to emerge through the anode and thus be recovered as useful radiation. However, metal surfaces also act to quench emission. Two distinct effects can act to quench emission from a light emitting layer if it is placed close to a metal electrode. If the light emissive layer is very close to the metal layer, for example if the distance between the light emitting species and the metal is as small as the emission wavelength/40, the energy of the emissive layer can be transferred directly to an electronic excitation of the metal, which results in conversion of the energy to heat. It is common practice in the fabrication of light emitting devices to design the structure in such a way that the emissive zone in the light emitting layer is spaced away from the metal electrode to minimise this effect. If the emissive species is at a greater distance from the metal electrode, for example at a distance of the emission wavelength/10, the energy can be captured as a plasmon wave at the surface of the metal. On planar surfaces the surface plasmon modes are non-radiative and thus act as a loss channel for the device, so impeding efficiency, see Barnes IEEE J. Light. Tech., 17, 2170 (1999), and Hobson et. al. IEEE J. Sel. Top. Quant. 8, 378. In a typical organic light emitting diode structure, if the emitting species is placed at a distance of 10 nm from a metal electrode, some 60% of the energy will be directly lost to the metal. If the emitting species is placed at a distance of 50 nm from the metal electrode, the loss of energy to the metal is reduced to about 8%, but some 47% of the energy is trapped as a surface plasmon mode.

In some applications emission through the anode may be either impractical or undesired. One example is emission from quantum wells embedded just below the surface of a high index semiconductor; here emission through the semiconducting wafer may be impractical. Another example is that of an organic LED built onto the surface of a silicon wafer. In both cases it would be convenient to accomplish emission through a semitransparent metal electrode. It is one of the aims of the present invention to improve the efficiency of such a scheme.

It is well known that in fabricating a light emitting organic device, it is desirable to use an electrode material having a low electronic work function for the cathode. Such low work function materials are desirable, because they minimise the energy barrier to the injection of electrons into typical organic semiconductor layers. Such low work function electrodes are normally metals such as calcium, lithium, the rare earth or lanthanide metals and their alloys. It is also known that cathode materials such as aluminium which have an intermediate value of work function together with an additional layer which promotes charge injection can be used. Such additional layers include a thin layer of lithium fluoride. It remains difficult to provide a low work function electrode which does not have a metallic character. Organic light emitting devices in which emission cannot take place through the anode must therefore, in general emit their light through a thin semi transparent metal cathode. The problem remains that much of the emitted light is trapped as surface plasmons.

If nothing is done to recover trapped guided modes such as SP modes then they represent a wasteful decay route for the excitons that generate the light and will reduce the external efficiency of the device.

Various attempts have been made to increase the light output from LEDs. Lupton et al Appl. Phys. Lett, 71, p 3340, 2000 discuss the use of a diffraction grating for increasing the brightness of the emitted light.

Typically such diffraction gratings are described as being added to the surface of the optoelectronic device, however in reality what results is a periodic microstructure extending through a number of layers. For example FIG. 1 illustrates a typical LED and FIG. 1a illustrates the LED of FIG. 1 after a periodic microstructure has been imparted on to it.

Figure 1:
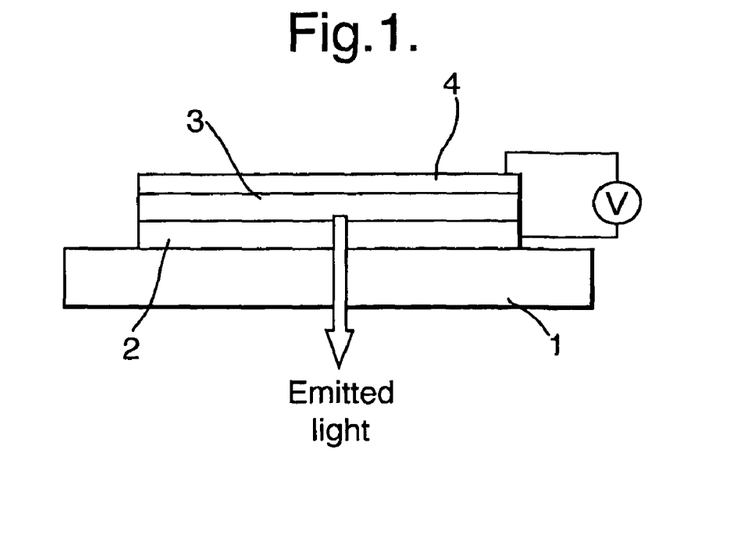
FIG. 1 illustrates a typical planar LED structure

In FIG. 1, the LED comprises a glass substrate 1 on to which have been deposited an anode 2, a light emitting layer 3 and a cathode 4 typically made from metal. The arrow indicates the usual direction of the emitted light.

Figure 1A:
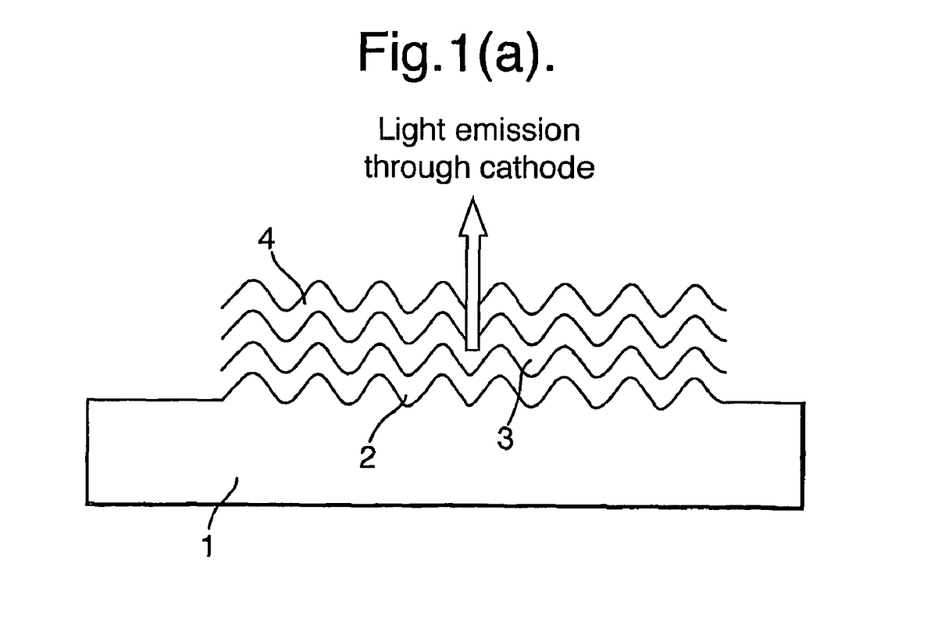
FIG. 1a illustrates a light emitting structure such as that illustrated in FIG. 1 with wavelength scale periodic corrugation incorporated

In FIG. 1a the periodic microstructure is represented as a corrugated layer. Typically the glass substrate 1 is spin-coated with photoresist, baked and exposed to laser light such that a wave pattern is formed in the photoresist. Following further processing and exposure to UV radiation to harden the photoresist, or use of reactive ion etching to transfer the pattern to the substrate, the anode 2, dielectric or semiconductor layer 3 (often referred to as a light emitting layer) and cathode 4 are deposited. The effect of depositing further layers on to the corrugated glass substrate is that this periodic microstructure extends through the subsequently deposited layers such that, in the example illustrated by FIG. 1a, the cathode 4 possesses a periodic microstructure.

In FIGS. 1 and 1a the interface between, for example the cathode 4 and "above" would, in the absence of a further layer be commonly referred to as the cathode/air interface.

It is an objective of the current invention to provide more efficient optoelectronic devices. This is realised partly by understanding more fully those processes occurring at the various interfaces of optoelectronic devices and the subsequent use of microstructures in such a way that SP modes are recovered as useful radiation.

The above description of devices has been framed primarily in the context of devices which emit light. Such devices include light emitting diodes, organic light emitting diodes, electroluminescent devices using thin film or powdered phosphors and light emitting polymer devices. Those skilled in the art will immediately recognise that the essential aspects of the discussion are common to these and to other light emitting devices. It will also be recognised that the same considerations apply to other electro-optic devices. For example, light detection and photovoltaic devices rely on light entering the device through an electrode structure and causing excitation of a semiconducting layer. Those skilled in the art will recognise that surface plasmon effects can correspondingly reduce the operational efficiency of light detecting and photovoltaic devices by trapping incident light, and that the problem may be reduced by the same means as for emissive devices. The same considerations and remedies apply to other devices, such as electro-optic modulators, switches etc which rely on a dielectric or semiconductor layer provided with at least one metal electrode.

The inventors of the present invention have analysed the mechanisms by which light may be coupled from surface plasmon modes at a metal surface into an emitted mode in the surrounding medium, by means of a periodic microstructure. Further the inventors have newly recognised the relative importance of surface plasmon modes supported at the inner and outer surfaces of the metal electrode, and the detailed effect of a periodic microstructure on the scattering of each. In particular the inventors have newly recognised that the surface plasmon modes supported at the inner surface of the metal electrode are of dominant importance in reducing the efficiency of devices, and that periodic microstructures described in the prior art are substantially ineffective in coupling light from surface plasmon modes at the inner surface of the metal electrode into emitted modes. Recently Gifford and Hall (App. Phys. Lett. Vol. 80, p 3679-3681, 2002 showed that emission could be enhanced if the periodic microstructure is used to couple the SP modes on the inner and outer metal surfaces together as well as coupling them to emitted radiation. In their work the SP mode at the inner surface is only coupled out under very specific matching conditions, so providing only limited recovery of power lost to the SP mode at the inner surface. The inventors of the present invention have further addressed this problem by the design and fabrication of a new type of periodic microstructure. By the inner surface of the metal electrode, is meant the surface of the metal electrode which is closer to the emissive layer in a light emitting device eg a dielectric or semiconductor layer. The inventors have found that the reason for the ineffectiveness of prior art microstructures lies in a destructive interference of light which occurs between light produced, via i/ and ii/ below:

i) Light scattered by a periodic microstructure from the surface plasmon mode at the inner metal electrode surface i.e. at the interface between the emissive layer and the metal electrode and then propagating through the electrode. The periodic microstructure is substantially present at the inner metal surface.

ii) Light scattered by a periodic microstructure substantially present at the outer metal surface by interaction with the evanescent wave associated with the surface plasmon mode at the Inner metal electrode surface.

According to a first aspect of this invention an optoelectronic device comprises:

a dielectric layer or a semiconductor layer sandwiched between electrode structures, wherein at least one of the electrodes is substantially metal comprising and at least semi-transparent, a periodic microstructure in contact with at least one surface of the substantially metal comprising and at least semi-transparent electrode, characterised in that the structure and positioning of the periodic microstructure is such that:

surface plasmon (SP) polariton modes supported mainly at the interface between the dielectric layer or semiconductor layer and the metal comprising, semi-transparent electrode are substantially scattered into propagating light, said propagation being out of the plane of the dielectric layer or semiconductor layer and the metal comprising, semi-transparent electrode interface.

By contact is meant physical and/or optical contact and by optical contact is taken to mean that the electric field associated with the SP mode supported at (or associated with) the dielectric layer or semiconductor layer and the metal comprising, semi-transparent electrode interface has a significant/appreciable amplitude at the periodic microstructure.

In practice it will often be the case that the periodic microstructure is in physical contact with the metal comprising semi-transparent electrode, however there may optionally be further semi-transparent or transparent layers positioned in between the various layers referred to above, for example there may be transparent layer(s) in between the periodic microstructure and the layers either side of the periodic microstructure.

Periodic microstructures include grating type structures such as a periodic sequence of valleys and hills, or a periodic sequence of grooves. They also include surfaces that are periodic in more than one direction on the surface, examples are the simultaneous presence of two grating structures and two dimensionally periodic arrangements of holes, bumps etc.

Periodic microstructures also includes structures which are described as quasi-periodic structures, one example of which is a so called Penrose tiling.

A periodic microstructure in contact with at least one of the electrodes includes the case where it is the said electrode that is microstructured.

By semi-transparent it is meant that said electrode allows sufficient light through for the device to operate and that the electrode is at least semi-transparent.

In specific examples and/or in discussions relating to the prior art herein the term emissive layer or light emitting layer is often used which is taken to mean the dielectric or semiconductor layer(s) which is (are) sandwiched between electrodes as referred to in the statement of invention. In the case of an electro-optic device which functions as a photovoltaic device, a photodiode or a photoresistive device, such dielectric and semiconducting layers may not actually be photo-emissive with a usefully high efficiency but will perform a corresponding electro-optic function by absorbing light and generating or passing electrical charge. It will be understood by those skilled in the field that the operation of such devices and others can be understood by considering light absorption rather than emission and charge separation rather than recombination and applying these changes mutatis mutandis according to the device under discussion.

An interface with the air is taken to mean an interface with the outer edge of the structure. A further layer may be added (encapsulation) at this interface—typically by using a further transparent layer.

Preferably the substantially metal comprising electrode means that said electrode comprises a metallic layer, more preferably the electrode is a metallic electrode such as aluminium. Preferably the metal comprising electrode is the cathode. Preferably the cathode is made from aluminium.

It was stated earlier in the current application that the present inventors have found that the reason for the ineffectiveness of prior art microstructures lies in a destructive interference of light which occurs between light produced substantially via two routes. The current invention in effect results in a substantial lack of such destructive interference.

Preferably the substantial lack of destructive interference is taken to mean that the interference of the light arising from each of the above identified scattering routes from a surface plasmon is such that at a chosen wavelength at least 50% of the power which in a planar structure would be trapped as a surface plasmon, is emitted as useful radiation. Preferably such substantial lack of destructive interference will lead to an overall increase in the external efficiency of the device of at least 10%.

Being out of the plane of the dielectric layer or semiconductor layer means that the propagating light is sufficiently out of the plane so that it can be emitted from the device as useful light.

SP modes supported mainly at the interface between the said layers and electrode is taken to mean the interface mode that comprises an oscillating electromagnetic field associated with an oscillating surface charge distribution in the metal, the electromagnetic field being such that it decays exponentially with distance away from the interface.

Preferably the periodic microstructure is selected from the following structures:
- the metal comprising electrode comprises a grating type structure on each of its surfaces (i.e. possessing wavelength scale periodic microstructure that is periodic in at least one direction in the plane of the device), wherein the relationship between the microstructure of the two metal comprising surfaces is such that they are out of phase by $\pi$ radians or substantially $\pi$ radians.
- a grating type structure present only at the interface between the metal comprising electrode and the layer into which electrons are injected ie the semiconductor or dielectric layer.
- a grating type structure present at the metal comprising electrode/air (or metal comprising electrode/encapsulation) interface only.
- a further dielectric layer present at the surface of the metal comprising electrode remote from the dielectric/semiconductor layer, on which is present a grating type structure.

In addition all of these structures may be such that they possess wavelength scale periodic microstructure in more than one direction in the plane of the device so that the microstructure extends in both the x and y directions in the plane of the device, as noted below.

For those periodic microstructures listed above the grating type structure may be a series of holes preferably sub-wavelength which have been made in the metal comprising electrode. Alternatively it may be a series of lines etched in to the appropriate surface, e.g. by laser. It may also be a series of bumps and dimples. Such techniques are well known to those skilled in the art.

By wavelength scale periodic microstructure is taken preferably to mean a periodic arrangement of bumps and hollows or grooves and ridges wherein the distance between successive bumps or grooves and the like is of the order of the wavelength involved or less.

By substantially $\pi$ radians is preferably taken to mean between and including $\pi/2$ and $3\pi/2$ radians.

To optimise the light extracted the periodic microstructure may be periodic in more than one dimension. For example a second (and optionally a third) microstructure or corrugation may be added, thus allowing surface plasmons propagating in all in-plane directions to be coupled to radiation. It has been demonstrated that this can be an efficient process, Worthing et al., Appl. Phys. Lett., 79, 3035 (2001). Multi-periodic microstructures include gratings etched at substantially 90° to each other where two gratings are used or at substantially 60° to each other where three gratings are used. It is understood that periodic microstructures may be fabricated by a variety of known methods including but not restricted to photolithography, e-beam lithography, chemical or plasma etching, laser machining or ablation, mechanical scribing or ruling, embossing, and selective exposure of a photopolymer.

By careful design of the periodic microstructure surface plasmon modes are recovered as useful radiation which in the case of a device such as an LED results in increased efficiency and increased brightness. Similarly it allows for sensors which may work more efficiently in lower lighting conditions Preferred optoelectronic devices include photodiodes, photovoltaics, light emitting diodes both organic and inorganic, light emitting polymer devices, emissive displays and solid state lighting elements.

The dielectric or semiconductor layer may itself consist of one or more layers. For example in the case of an LED the dielectric or semiconductor layer typically possesses the following three properties: electron transporting (ET); hole transporting (HT); light emitting (LE). If the layer of material is a single layer then the single layer of material must exhibit all three properties. For the case when the layer of material is a single layer then the material may consist of a single material, for example in a typical organic LED polyphenylenevinylene, or by mixing two or more materials with appropriate properties together, for example N,N'-diphenyl-N,N'-ditolyl-benzidine (HT), Coumarin 6 Laser dye (LE) and t-Butylphenyl 4-biphenylyl-oxadiazole (ET) which may be abbreviated to PBT. For the case when the layer of organic material comprises more than one layer then suitable examples include:
  i/ Layer 1=HT layer, Layer 2=LE layer, Layer 3=ET layer
  ii/ Layer 1=HT layer, Layer 2=material which acts as an ET medium but also emits light (LE), for example Aluminium tris 8-hydroxyquinolinate (Alq3)
  iii/ Layer 1=HT and LE, Layer 2=ET
  iv/ The LE material may be doped in small quantities—typically 0.5% into ET or HT or both. Typical doping agents are coumarin 6 or pentaphenyl cyclopentadiene. In cases where concentration quenching is not severe, larger doping concentrations, for example, 10% may be used. Examples of suitable dopants include rubrene, and complexes of terbium, europium and iridium.

Preferably in the case where the layer of material is a multiplicity of layers, then the layer adjacent to the cathode preferentially transports electrons and/or the layer adjacent the anode preferentially transports holes. Preferably the luminescent material has a high quantum efficiency of luminescence. The luminescent component may be combined with a charge transporting material or may be present in a separate layer.

The dielectric or semiconductor layer may be deposited on the anode by any of the following techniques: thermal evaporation under vacuum, sputtering, chemical vapour deposition, spin depositing from solution or other conventional thin film technology. Other suitable techniques will be apparent to those skilled in the art.

The thickness of the dielectric or semiconductor layer is typically 30-2000 nm, preferably 50-500 nm. The device may contain further layers which are situated next to the electrodes and the semiconductor or dielectric layer—these further layers may be conducting or insulating and act as a barrier to diffusion of the electrode material or as a barrier to chemical reaction at the electrode and dielectric or semiconductor layer interface and/or may act to facilitate injection of charge into the adjacent layer. Examples of suitable materials for these further layers include emeraldine which prevents indium diffusion into the layer of dielectric or semiconductor from an ITO electrode, or, for the same reason, copper phthalocyanine may be used; alternatively the addition of a thin layer (~0.5 nm) of lithium or magnesium fluoride at the interface between a lithium electrode and the dielectric or semiconductor layer may be used.

Hence preferably according to the present invention an optoelectronic device comprises:

a dielectric layer or a semiconductor layer sandwiched between electrode structures, wherein at least one of the electrodes is metallic and semi-transparent;

a periodic microstructure in contact with the metallic semi-transparent electrode wherein the periodic microstructure is given by one of the following structures:

a grating type structure which is in contact with both sides of the metallic semi-transparent electrode, wherein the relationship between the microstructure of the two surfaces of the grating type structure is such that they are out of phase by $\pi$ or substantially $\pi$;

a grating type structure present only at the interface between the metallic semi-transparent electrode and the semiconductor or dielectric layer;

a grating type structure present at the metallic semi-transparent electrode/air interface only;

a grating type structure present on a further dielectric layer present at the surface of the metallic semi-transparent electrode said surface being remote from the dielectric layer or semiconductor layer.

Preferably the metallic semi-transparent electrode is the cathode.

For all of the aspects of the present invention at any of the interfaces of the optoelectronic device there may be present transparent layers—when such a layer is used at the interface with the air then this is generally referred to as an encapsulation layer. For example the semi-transparent electrode air interface may have an encapsulation layer.

All of the previously disclosed statements in relation to the first aspect of the invention are applicable to this preferred aspect of the invention.

The invention will now be described by way of example only with reference to the following Figures.

In order that the invention may be more readily understood it is necessary to more fully understand some of those processes occurring in optoelectronic devices such as LEDs.

Figure 2:
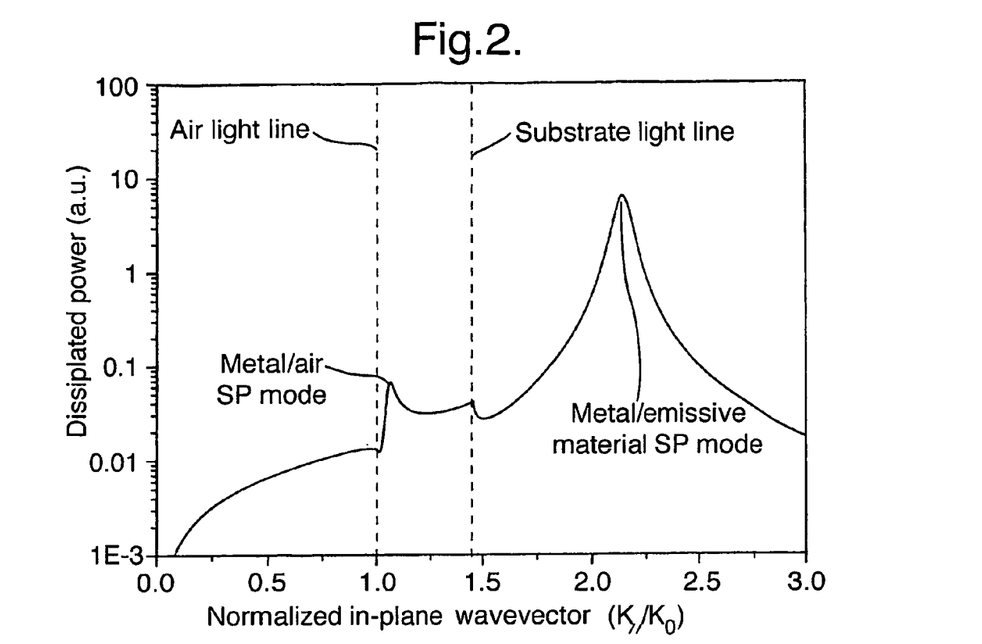
FIG. 2 illustrates a power dissipation spectrum for an emitter embedded in an emissive layer ($Alq_3$) in close proximity (30 nm) to a thin (30 nm) silver layer (simulating the cathode)

To gain a quantitative idea of the nature of the problem that SP modes represent, the current inventors have calculated the power coupled to the different modes using well established techniques of Ford et al, Phys. Rep., 113, 195 (1984) and Wasey et al, J. Mod. Opt., 47, 725 (2000). FIG. 2 illustrates the power coupled from an emitter as a function of in-plane wavevector. By way of example the structure investigated comprises a 60 nm layer of light emitting material (e.g. $Alq_3$) fabricated on top of a glass substrate, and coated with 30 nm of silver, to simulate a cathode. The calculation is for an emitter in the middle of the emissive layer, i.e. 30 nm from the metal surface. The different peaks in FIG. 2 represent different modes to which the emitter may couple; the area under each peak represents the power coupled to that mode. In addition to radiation a very significant amount of power is coupled to surface plasmon modes, notably the SP mode associated with the metal/emissive material interface. (There are two SP modes in this structure, one associated with the metal/air interface, the other associated with the metal/emissive material interface). If nothing is done to recover trapped guided modes such as these SP modes then they represent a wasteful decay route for the excitons and will reduce the efficiency of the device.

From FIG. 2 it is clear that molecules lose a very significant fraction of their energy to the SP mode associated with the metal/emissive material interface (in this case the $Ag/Alq_3$ interface). If nothing is done to recover the power coupled to this SP mode then the efficiency of the device will always be sub optimal.

The structure in FIG. 1a was fabricated as follows, in this instance with the absence of an anode. A film of Shipley Megaposit 700 was deposited onto a planar silica glass slide 1 by spin coating. The corrugated surface, taking the form of a diffraction grating ($\lambda_g$=412 nm) was then produced in the photoresist by means of holographic lithography Kitson et al, IEEE. Phot. Tech. Lett., 8, 1662, 1996. The structure was then placed in a reactive ion etcher where $CHF_3$ and $O_2$ gases were used to etch the grating profile into the silica substrate and to remove the remainder of the photoresist layer. Onto the textured substrate the $Alq_3$ (70 nm) layer 3 and silver (30 nm) films 4 were sequentially evaporated. The pitch of the grating needs to be appropriately chosen. The grating produced here had a surface profile that can be approximated by a sine wave, $y(x)=a_0 \sin(k_g x)$ where $k_g=2\pi/\lambda_g$, $\lambda_g$ is the pitch of the grating. In the present case the pitch was 412 nm and the amplitude of the surface profile was $a_0 \sim 25$ nm. The condition on the pitch is that the surface plasmon modes supported by the structure (see FIG. 2) can be Bragg scattered by the periodic corrugation and in so doing be coupled to far-field radiation. Thus the pitch of the grating must be such that, $$k_{SP} \pm nk_g < \pm k_0$$

where $k_0$ is the wavevector of a photon at the emission frequency in free space, $k_{SP}$ is the in-plane wavevector of the SP mode that is to be coupled to radiation and $k_g$ is the Bragg vector associated with the corrugation. The integer n is the order of the Bragg scattering and usually takes the value n=1, i.e. lowest order scattering. The amplitude is an important parameter in determining the efficiency of the scattering process, and should typically be of the order of $\approx \lambda_0/10$ where $\lambda_0$ is the free space emission wavelength of the emissive material.

Figure 3:
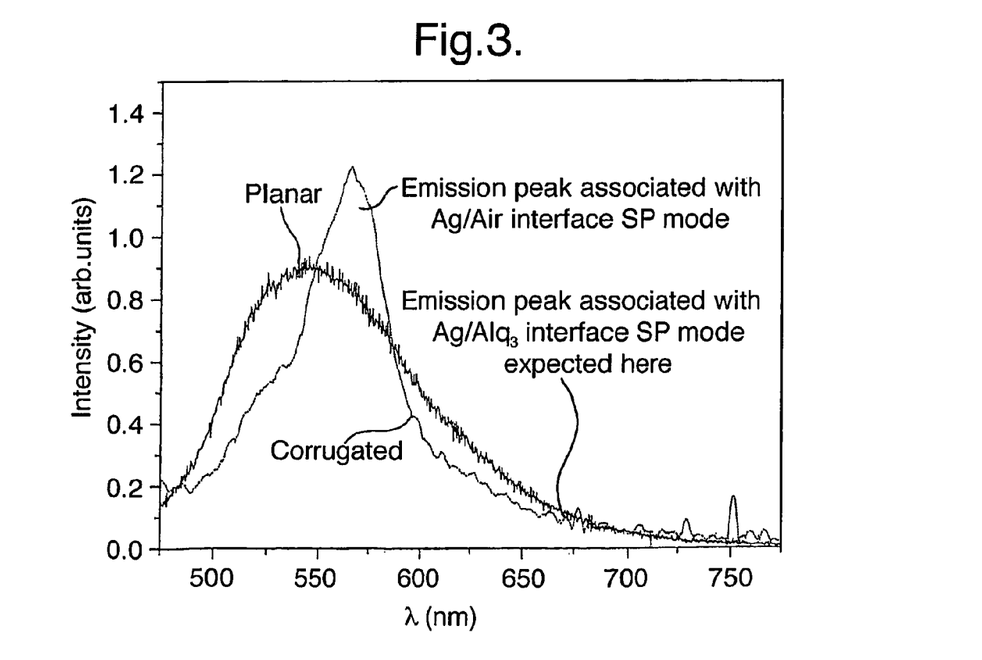
FIG. 3 illustrates emission spectra recorded at a polar emission angle of 19 degrees. The mode assignments are made by reference to measurements and calculations of the dispersion of the optical modes of this structure. The spectra were obtained by using a device as illustrated in FIG. 1a FIGS. 4a-d illustrate periodic microstructures for use in the present invention 4a illustrates a bi-grating where the individual gratings are out of phase by $\pi$ with respect to each other 4b illustrates a periodic microstructure at the cathode/air interface only 4c illustrates a periodic microstructure at the interface between cathode and dielectric or semiconductor layer only 4d illustrates the case where a further dielectric layer is deposited on the cathode and wherein there is a periodic microstructure at the further dielectric layer/air interface only

The emission spectrum for light emerging through the metallic layer should include features due to the SP modes associated with the structure. The results, shown in FIG. 3, show that emission associated with the metal/air plasmon dominates the recorded emission. Given that the emitters couple much more strongly to the surface plasmon associated with the metal/emissive layer interface (see FIG. 2), these results indicate that the metal/emissive layer surface plasmon is very poorly coupled to radiation by this structure.

The inventors of the current invention have found that the reason for this weak coupling of the metal/emissive layer SP mode to radiation, is a result of destructive interference between the two scattering processes that may couple the SP mode to radiation. The two processes are:

1. The SP mode is scattered by the lower (metal/emissive layer) corrugation and propagates through the metal to emerge in the air.
2. The SP mode penetrates through the metal, is scattered by the upper (metal/air) corrugation, to emerge in the air.

The net phase incurred in these two scattering processes differ by $\pi$ so that they interfere destructively. By contrast, the upper, metal/air surface plasmon has only one route for scattering so as to produce radiation in the air—there can thus be no cancellation due to destructive interference, thus explaining why this mode is seen in the spectra shown in FIG. 2, despite being only very weakly excited by the emissive layer.

FIGS. 4a-d illustrate examples according to the present invention of how the phase difference between SP modes may be altered and the interference conditions changed from destructive to constructive.

Figure 4A:
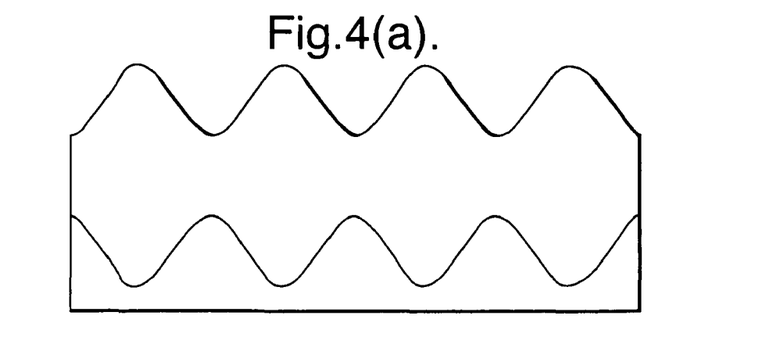

In FIG. 4a the two periodic microstructures or surface corrugations are slipped by $\pi$ relative to each other.

Figure 4B:
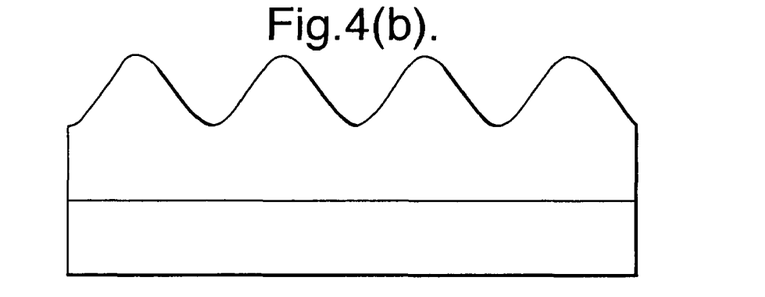

In FIG. 4b there is present a periodic microstructure at the cathode/air interface only.

Figure 4C:
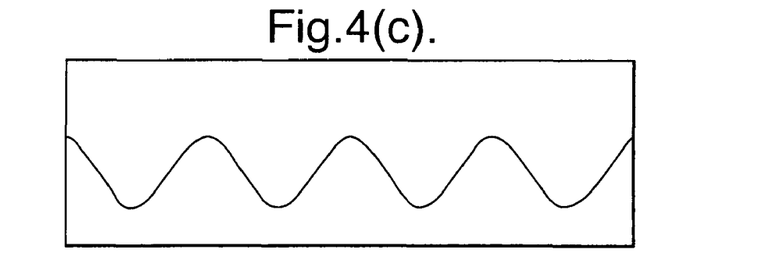

In FIG. 4c there is present a periodic microstructure on the dielectric or semiconductor layer (may be generally referred to as an emitter or emissive layer) and the interface with the cathode only.

Figure 4D:
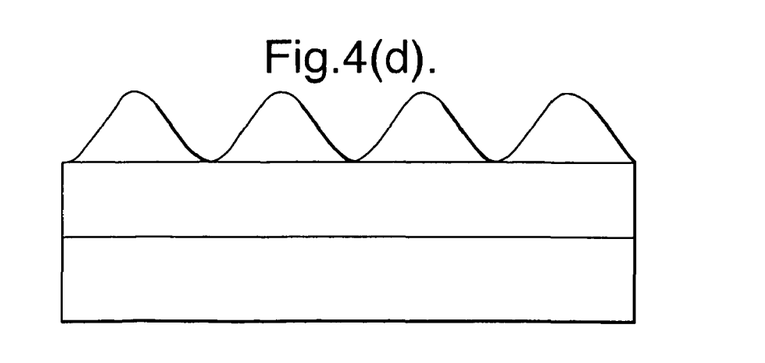

In FIG. 4d there is a layer of dielectric or semiconductor (the anode is not shown), a metal comprising cathode which is flat or substantially flat on both surfaces. Instead of the next layer being air there is deposited a further dielectric layer with a periodic microstructure.

With respect to the structure illustrated in FIG. 4d this affords advantages in terms of the fabrication process in that the final dielectric layer could be deposited on an already formed planar metal comprising cathode.

Figure 5:
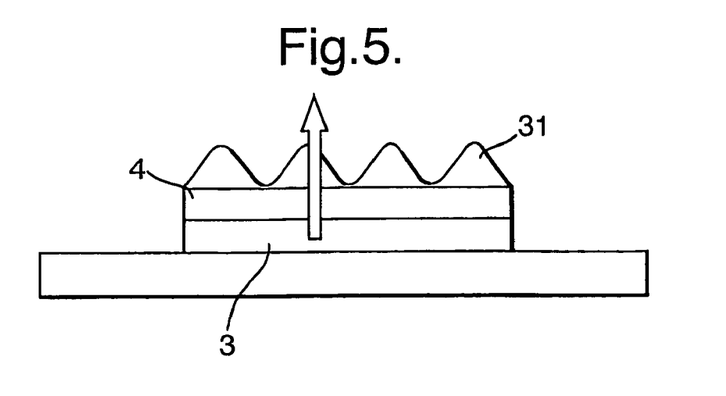
FIG. 5 illustrates a device according to the present invention

FIG. 5 illustrates a device according to the present invention which is used to illustrate the effect of use of a periodic microstructure according to the present invention. There is present an anode, a layer of dielectric or semiconductor, a metal comprising cathode and instead of the next layer being air there is deposited a further dielectric layer 31 possessing periodic microstructure on top of the cathode 4.

A structure similar to that shown in FIG. 5 was fabricated, but without the presence of an anode. A layer of emissive material ($Alq_3$) was deposited by vacuum sublimation, after which a thin ($\sim$30 nm) layer of metal (Silver) was deposited to represent a cathode. A thin ($\sim$100 nm) layer of photoresist was then added by spin coating. The photoresist was then exposed to an interference pattern produced by interfering two laser beams, chemical development being used to translate the exposure modulation into a physical modulation of the photoresist.

Figure 6:
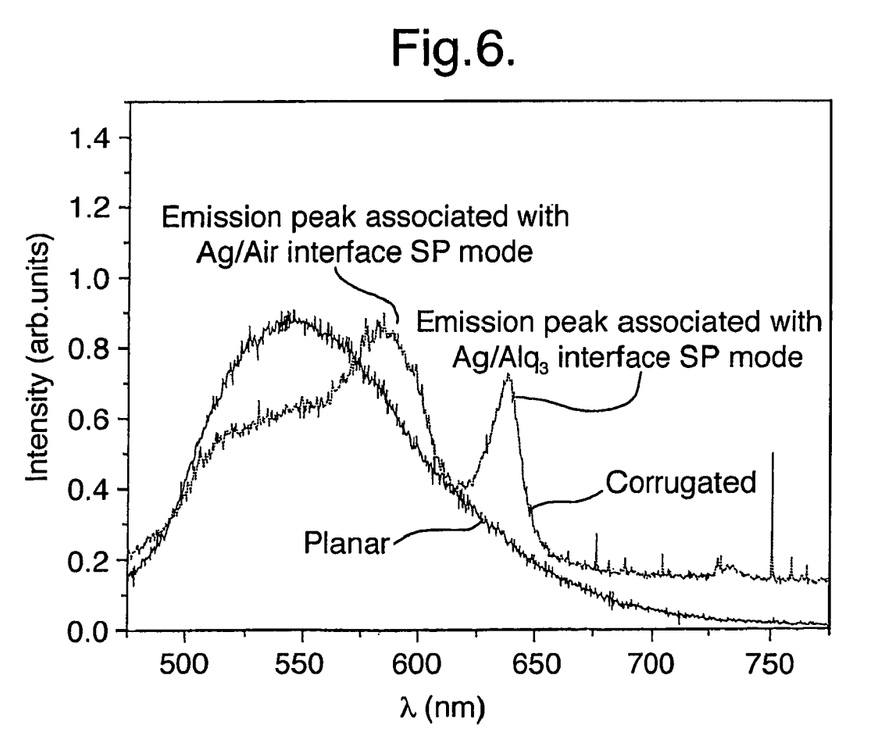
FIG. 6 illustrates emission spectra (photoluminescence) recorded at a polar emission angle of 11 degrees by use of the device in FIG. 5

The emission spectrum from the structure illustrated in FIG. 5 is shown in FIG. 6. The SP mode associated with the metal comprising electrode/dielectric or semiconductor layer (generally referred to as the emissive layer) interface is now the stronger of the surface plasmon features (when compared to the intrinsic emission spectrum).

Figure 7A:
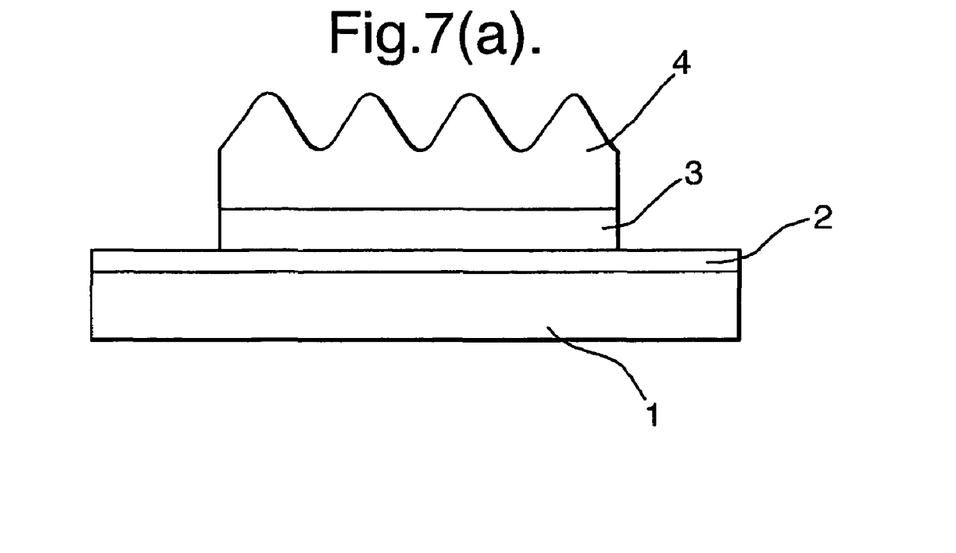
FIGS. 7a-c illustrate a device according to the present invention
Figure 7B:
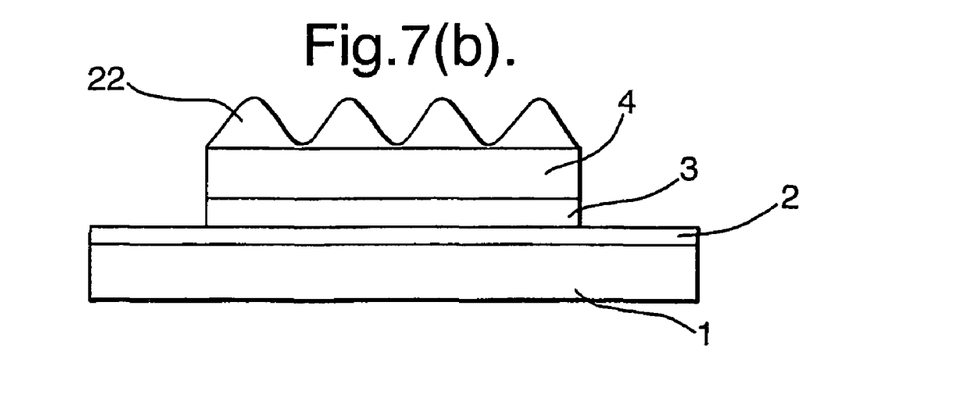
Figure 7C:
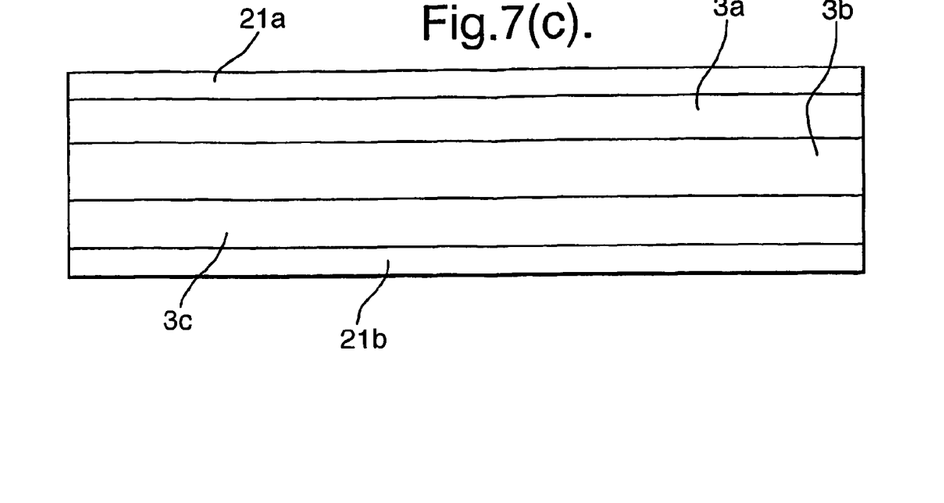

FIGS. 7a-c illustrate further examples of LED devices constructed according to the present invention. A substrate typically made of glass 1 is sequentially overlaid with an anode 2 typically made of Indium Tin Oxide (ITO), a dielectric or semiconductor layer 3 (often referred to as any of an emissive layer or a light emitting layer) which may be essentially of an organic or inorganic nature. This layer may itself consist of one or more layers represented in FIG. 7c as 3a, 3b, 3c. The layer of material 3 possesses the following three properties: electron transporting (ET); hole transporting (HT); light emitting (LE). If the layer of material 3 is a single layer then the single layer of material 3 must exhibit all three properties. For the case when the layer of material 3 is a single layer then the material may consist of a single material, for example in an Organic LED (OLED) polyphenylenevinylene, or by mixing two or more materials with appropriate properties together, for example N,N'-diphenyl-N,N'-ditolylbenzidine (HT), Coumarin 6 Laser dye (LE) and t-Butylphenyl 4-biphenylyl-oxadiazole (ET) which may be abbreviated to PBT. For the case when the layer of material 3 comprises more than one layer then suitable examples include:

i/ 3a=HT layer, 3b=LE layer, 3c=ET layer ii/ 3a=HT layer, 3b=material which acts as an ET medium but also emits light (LE), for example Aluminium tris 8-hydroxyquinolinate (Alq3)

iii/ 3a=HT and LE, 3b=ET iv/ The LE material may be doped in small quantities—typically 0.5% into ET or HT or both. Typical doping agents are coumarin 6 or pentaphenyl cyclopentadiene.

Preferably in the case where the layer of material 3 is a multiplicity of layers, then the layer adjacent to the cathode preferentially transports electrons and/or the layer adjacent the anode preferentially transports holes. Preferably the luminescent material has a high quantum efficiency of luminescence. The luminescent component may be combined with a charge transporting material or may be present in a separate layer.

The layer of material 3 may be deposited on the anode 2 by any of the following techniques: thermal evaporation under vacuum, sputtering, chemical vapour deposition, spin depositing from solution or other conventional thin film technology.

The thickness of the layer of material 3 is typically 30-2000 nm, preferably 50-500 nm. The device may contain layers 21a and 21b (see FIG. 7c) which are situated next to the electrodes 2 and 4, these layers 21a and 21b may be conducting or insulating and act as a barrier to diffusion of the electrode material or as a barrier to chemical reaction at the electrodes 2,4 and layer of organic material 3 interface. Examples of suitable materials for 21a and 21b include emeraldine which prevents indium diffusion into the layer of (organic) material 3 from an ITO electrode, or, for the same reason, copper phthalocyanine may be used; alternatively or additionally the addition of a thin layer (~0.5 nm) of lithium or magnesium fluoride at the interface between a lithium electrode and the layer of (organic) material 3 may be used.

The metal comprising periodically microstructured cathode illustrated in FIG. 7a is typically, when compared to standard cathodes for use in LEDs, thinner. The cathode possesses a planar lower surface and a sinusoidally modulated top surface, the pitch of the modulation is of the order of $\lambda_0/2$, for emission in the visible the pitch will thus be ~250-300 nm. The mean thickness of the cathode may be ~20-40 nm, whilst the amplitude of modulation is typically ~10-30 nm. The textured profile of the top metal comprising layer is produced by a number of techniques including etching through a photoresist grating formed on top of the cathode. Alternatively a cathode in which the modulation is deep enough to penetrate the cathode completely, leaving a metal film full of holes may be provided. In another variant the semiconductor or dielectric layer may have its top surface modulated and a cathode added that has a planar top surface.

Another variant device structure has a textured dielectric layer 22 added above the cathode, as shown in FIG. 7b (see layer 31 in FIG. 5). Here the cathode is relatively thin and planar, ~30 nm. It is covered by a textured dielectric layer. The textured dielectric layer serves the same purpose as the directly textured cathode of FIG. 7a, it allows the surface plasmon modes to be Bragg scattered out of the device as useful radiation. The thickness of this layer must be thin enough to avoid the introduction of further waveguide modes. Typically this may be avoided if the textured dielectric layer has a thickness of the order of one sixth the emitted wavelength if the dielectric layer has optical properties typical of common organic materials. It is further desirable for the texture to comprise a thickness modulation of at least one tenth the emitted wavelength in order to achieve strong scattering.

For those devices described by FIGS. 7a-c the periodic microstructures of FIGS. 4a and 4c may alternatively be incorporated in to devices 7a-c.

The device of FIG. 7a-c may be a single pixel device or it may be matrix addressed. An example of a matrix addressed OLED is shown in plan view in FIG. 8. The display of FIG. 8 has the internal structure described in FIG. 7a-c but the substrate electrode 5 is split into strip-like rows 5l to 5m and similar column electrodes 6l to 6n, this forms an m×n matrix of addressable elements or pixels. Each pixel is formed by the intersection of a row and column electrode.

Figure 8:
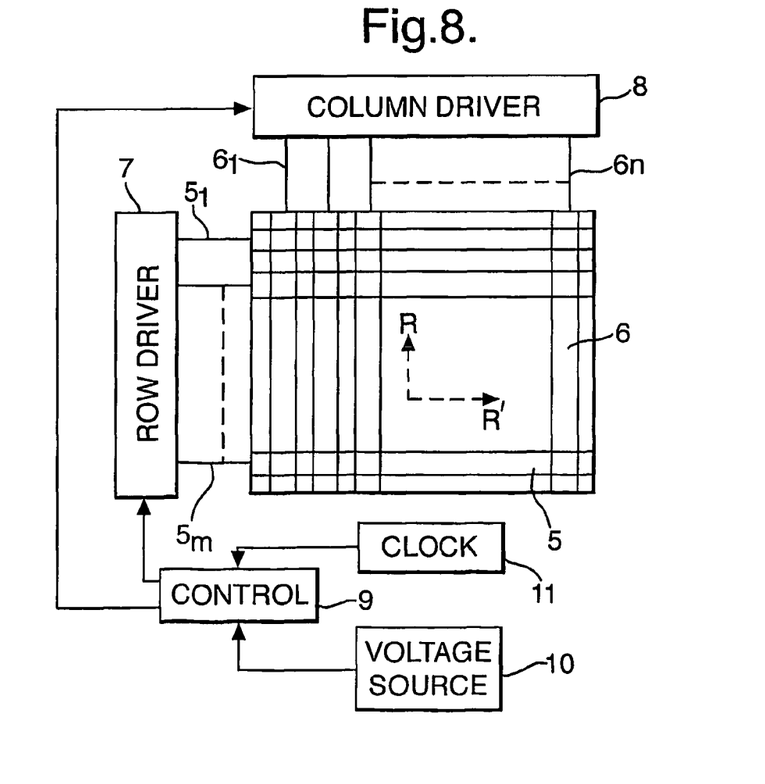
FIG. 8 illustrates a multiplexed addressed device according to the present invention.

A row driver 7 supplies voltage to each row electrode 5. Similarly, a column driver 8 supplies voltage to each column electrode. Control of applied voltages is from a control logic 9 which receives power from a voltage source 10 and timing from a clock 11.

An organic photovoltaic device comprises a thin stratified layer of organic semiconductor placed between two electrically conducting electrodes, at least one of which is at least semi-transparent. The stratified layer of organic semiconductor is so disposed that the organic semiconductor in contact with one electrode is a n-type semiconductor, and that in contact with the other electrode is a p-type semiconductor. Within the thickness of the organic layer, a p-n junction is formed. Light absorbed in the organic semiconductor layer causes electronic excitation of one or more molecules to provide an excited state molecule, excimer or exciplex which may dissociate to provide a pair of charge carriers of opposite charge. If the pair of charge carriers is formed in close proximity to the organic p-n junction, one charge carrier may diffuse across the junction resulting in permanent separation of the charges. Further diffusion of the charge carriers to the electrodes results, under constant illumination, in an electrical potential difference and/or external current flow between the electrodes. In order to achieve high conversion efficiency of light energy into electrical power, light should preferably be absorbed by the organic semiconductor layer very close to the p-n junction in order to increase the probability of diffusion of a charge carrier across the junction. Means to increase this probability include creation of a roughened or diffuse p-n junction, inclusion of the organic semiconductor layer in an optical resonant cavity having an antinode close to the plane of the p-n junction, and having light traverse the organic semiconductor layer at an oblique angle. It will readily be understood by those skilled in the art that according to the physical principle of reversibility of light the effects described above relating to an organic light emitting device and the effects of a metal electrode thereon are exactly paralleled in a photovoltaic device on which light is incident. Means by which the efficiency of out-coupling of light from an organic LED are improved, also increase the efficiency of in-coupling of light into an organic photovoltaic device and may be applied to increase its efficiency and power generation capacity.

An organic photodiode comprises a similar structure to that of an organic photovoltaic device but is used as a device to detect or measure incident light. Such a photodiode is often operated under an externally applied electrical potential difference, and the resulting photocurrent is monitored. It will be apparent that like organic photovoltaic devices, organic photodiodes may be improved by increasing the efficiency of in-coupling of externally incident light.

The invention claimed is:

1. An optoelectronic device comprising:
   at least one luminescent layer of dielectric material or semiconductor material,
   first and second electrodes sandwiching the at least one luminescent layer,
   wherein at least one of the electrodes is of semitransparent metal covering and separating said layer from air;
   and wherein the semitransparent metal electrode has two surfaces, each of which includes a periodic grating type microstructure, wherein the structure and positioning of the periodic microstructure is such that surface plasmon (SP) polariton modes are supported predominantly at an interface between the at least one luminescent layer and the metal electrode and are substantially Bragg scattered into light propagating out of the plane of the at least one luminescent layer and the metal electrode, and the optoelectronic light emitting device having a luminescence emission spectrum exhibiting:
   i) light from a first SP polariton mode which is associated with constructive interference corresponding to two Bragg scattering processes, and
   ii) light from a second SP polariton mode corresponding to one Bragg scattering process, the microstructures being out of phase by $\pi$ radians or substantially $\pi$ radians.

2. A device according to claim 1 wherein the periodic microstructure is one of a sequence of valleys and hills, and a sequence of grooves.

3. A device according to claim 1 wherein the periodic microstructures are periodic in more than one direction on the surface.

4. A device according to claim 1 wherein the periodic microstructures are sub-wavelength.

5. A device according to claim 1 wherein the metal comprising electrode is an aluminium cathode.

6. A device according to claim 1 comprising an organic light emitting diode.

7. An optoelectronic device consisting of an organic photovoltaic or photodiode device comprising:
   at least one layer of dielectric material or semiconductor material,
   first and second electrodes sandwiching the at least one layer,
   wherein at least one of the electrodes is a thin, continuous, non-perforated semitransparent metal covering and separating said layer from air;
   and wherein the semitransparent metal electrode has two surfaces each of which includes a periodic grating type microstructure, wherein the structure and positioning of the periodic microstructure is such that surface plasmon (SP) polariton modes are supported predominantly at an interface between the at least one layer and the semitransparent metal electrode and are substantially coupled propagating radiation out of the plane of the at least one layer by Bragg scattering, and the optoelectronic device has optical properties showing an SP polariton mode contribution which is associated with avoidance of destructive interference which would otherwise counteract that contribution;
   the microstructures being out of phase by $\pi$ radians or substantially $\pi$ radians.

8. A device according to claim 7 wherein the periodic microstructure is one of a sequence of valleys and hills, and a sequence of grooves.

9. A device according to claim 8 wherein the periodic microstructures are periodic in more than one direction on the surface.

10. A device according to claim 8 wherein the periodic microstructures are sub-wavelength.

11. A device according to claim 8 wherein the metal comprising electrode is an aluminium cathode.

12. A device according claim 8 wherein:
   a) the at least one layer is a thin stratified layer of organic semiconductor sandwiched by the first and second electrodes;
   b) the stratified layer has an n-type semiconductor region in contact with one of the electrodes and a p-type semiconductor region in contact with the other of the electrodes.

* * * * *